United States Patent [19]

Martin

[11] Patent Number: 5,776,355
[45] Date of Patent: Jul. 7, 1998

[54] METHOD OF PREPARING CUTTING TOOL SUBSTRATE MATERIALS FOR DEPOSITION OF A MORE ADHERENT DIAMOND COATING AND PRODUCTS RESULTING THEREFROM

[75] Inventor: Scott D. Martin, Paxton, Mass.

[73] Assignee: Saint-Gobain/Norton Industrial Ceramics Corp., Worcester, Mass.

[21] Appl. No.: 585,340

[22] Filed: Jan. 11, 1996

[51] Int. Cl.$^6$ .................................................. B23K 26/00
[52] U.S. Cl. .................... 216/52; 216/65; 427/249; 427/299; 427/307; 427/309; 51/307
[58] Field of Search ................................ 216/52, 65, 81; 51/293, 307; 427/249, 299, 307, 309

[56] References Cited

U.S. PATENT DOCUMENTS

| | | | |
|---|---|---|---|
| 5,139,372 | 8/1992 | Tanabe et al. | 407/118 |
| 5,435,889 | 7/1995 | Dietrich | 216/63 |
| 5,558,789 | 9/1996 | Singh | 219/121.69 |

*Primary Examiner*—R. Bruce Breneman
*Assistant Examiner*—Anita Alanko
*Attorney, Agent, or Firm*—Volker R. Ulbrich; David P. Gordon

[57] ABSTRACT

Methods for preparing a cutting tool substrate material for diamond coating include providing a grooved pattern on selected portions of at least the top surface and preferably also the sides of the substrate material. The pattern may be a cross-hatching, a diamond-hatching, or another design. The pattern is preferably applied to the tool substrate by scribing with a laser ablation tool. The pattern is designed to optimize adhesion of CVD diamond on the portions of the tool substrate which are expected to be most challenged during a cutting process. The dimensions of the pattern (e.g. the depth and spacing of scribe lines) are selected to provide the optimum combination of mechanical bonding and diamond nucleation during the CVD coating of the tool substrate. According to preferred aspects of the invention, the pattern is applied only to the portions of the surface not immediately adjacent to the cutting edge of the tool substrate, thereby sparing the geometry of the cutting edge itself. According to a one embodiment of the invention, the pattern includes a cross hatch on the top surface and on the side surfaces of the substrate. According to a another embodiment, the top surface is cross hatched in the center while the corners of the top surface are provided with parallel grooves. In another embodiment, the side surfaces are provided with parallel grooves parallel to the top surface.

27 Claims, 5 Drawing Sheets

METHOD OF PREPARING CUTTING TOOL SUBSTRATE MATERIALS FOR DEPOSITION OF A MORE ADHERENT DIAMOND COATING AND PRODUCTS RESULTING THEREFROM

This application is related to co-owned application U.S. Ser. No. 08/424,025, filed Apr. 18, 1995, now U.S. Pat. No. 5,643,523 entitled "Method of Manufacturing Diamond-Coated Cutting Tool Inserts and Products Resulting Therefrom", the complete disclosure of which is hereby incorporated herein by reference.

BACKGROUND OF THE INVENTION

1. Field of the Invention

This invention relates broadly to diamond coated cutting tool materials. More particularly, this invention relates to methods of preparing cutting tool substrate materials prior to chemical vapor deposition (CVD) of diamond to obtain a more adherent diamond coating on the tool substrate materials.

2. State of the Art

Diamond coated cutting tool substrate materials, such as cutting tool inserts, are well known and are typically made from a hard substrate such as silicon carbide (SiC), silicon nitride ($Si_3N_4$), or tungsten carbide (WC) which is subjected to chemical vapor deposition of diamond.

A disadvantage of prior art CVD diamond coated cutting tool materials has been that the diamond coating is not always sufficiently adherent to the tool material substrate. This results in a shortened tool life, as the diamond coating tends to spall off the substrate during a cutting process. The adherence of the film to the substrate has both a mechanical and a chemical component. Obtaining a good chemical adherence to WC substrates is particularly difficult because the cobalt binder matrix for the WC grains tends to convert diamond film to graphite at CVD temperatures, resulting in poor interfacial bonding of the diamond to the WC. Therefore, when coating WC substrates, it is necessary to maximize mechanical adherence. It is known in the art to roughen the surface of the WC substrate prior to CVD to improve mechanical adherence of the diamond coating to the substrate. On the other hand, it is generally agreed that the rake face of the tool should have a smooth surface in order to decrease friction when cuttings pass over it. Therefore, roughening the rake face should be avoided. It is also known to selectively grind portions of a tool substrate material to roughen portions of its surface. Grinding provides a unidirectional roughening, however, and adherence is not significantly improved.

A known CVD diamond coated cutting tool 10 is shown in prior art FIG. 1. Diamond is coated on the top 12 and side 14 faces of the tool 10 including at the cutting edge 16. After only a few minutes of use, the diamond coating on the top surface 12 of the tool 10 begins to spall off away from the cutting edge 16 as shown prior art in FIG. 2. Further use of the tool results in spalling of the diamond coating along the side surface 14 adjacent to the cutting edge 16 as shown in FIGS. 3–5.

A relatively new technique for preparing cutting tools prior to CVD coating is disclosed in Japanese Unexamined Pat. Application Hei. 6-183890, published July 5, 1994. The technique is illustrated in prior art FIG. 6 where the top surface 12 of a cutting tool 10 is scored with channels 18 using an excimer laser. The channels 18 are parallel to each other and parallel to one side edge 20 of the tool 10 (consequently perpendicular to the other side edge 22 of the tool 10). After the tool is thus treated, it is rinsed, washed, and coated with CVD diamond. While the Japanese technique is somewhat effective in reducing spalling off the top surface of the tool, it is not completely effective. Moreover, the technique is ineffective in reducing spalling off the side surfaces of the tool.

SUMMARY OF THE INVENTION

It is a therefore an object of the invention to provide a method for preparing cutting tool substrate materials so that a more strongly adherent diamond coating is achieved with CVD.

It is another object of the invention to provide a method for preparing cutting tool substrate materials for diamond coating with CVD which does not dull the cutting edge of the substrate material.

It is a further object of the invention to provide a method of manufacturing a diamond coated cutting tool insert so that diamond coating is more strongly adhered on the side surfaces as well as on the top surface.

In accord with the objects which will be discussed in detail below, the methods according to the invention include providing a distinct pattern of grooves on selected portions of at least the top surface and preferably also the sides of a cutting tool substrate material. The pattern may be a cross-hatching, a diamond-hatching, or another design. The pattern is preferably applied to the tool substrate by scribing with a laser ablation tool. The pattern is designed to optimize adhesion of CVD diamond on the portions of the tool substrate which are expected to be most challenged during a cutting process. The dimensions of the pattern (e.g. the depth and spacing of scribe lines) are selected to provide the optimum combination of mechanical bonding and diamond nucleation during the CVD coating of the tool substrate. According to a preferred aspect of the invention, the pattern is applied only to the portions of the surface not immediately adjacent to the cutting edge of the tool substrate, thereby sparing the geometry of the cutting edge itself. During CVD, diamond adhesion and growth are enhanced on the portions of the surface where the pattern is applied.

According to a first embodiment of the invention, the pattern includes a cross hatch on the top surface and on the side surfaces of the substrate. According to a second embodiment, the hatching is omitted from the top surface and the side surfaces near the edges of the substrate. According to a third embodiment, the top surface is cross hatched in the center while the corners of the top surface are provided with parallel 45° grooves. In the second embodiment, the side surfaces are provided with parallel grooves parallel to the top surface. In each of the embodiments, it may be advantageous to etch the substrate with acid prior to CVD coating.

DETAILED DESCRIPTION OF THE PREFERRED EMBODIMENT

Figure 1:
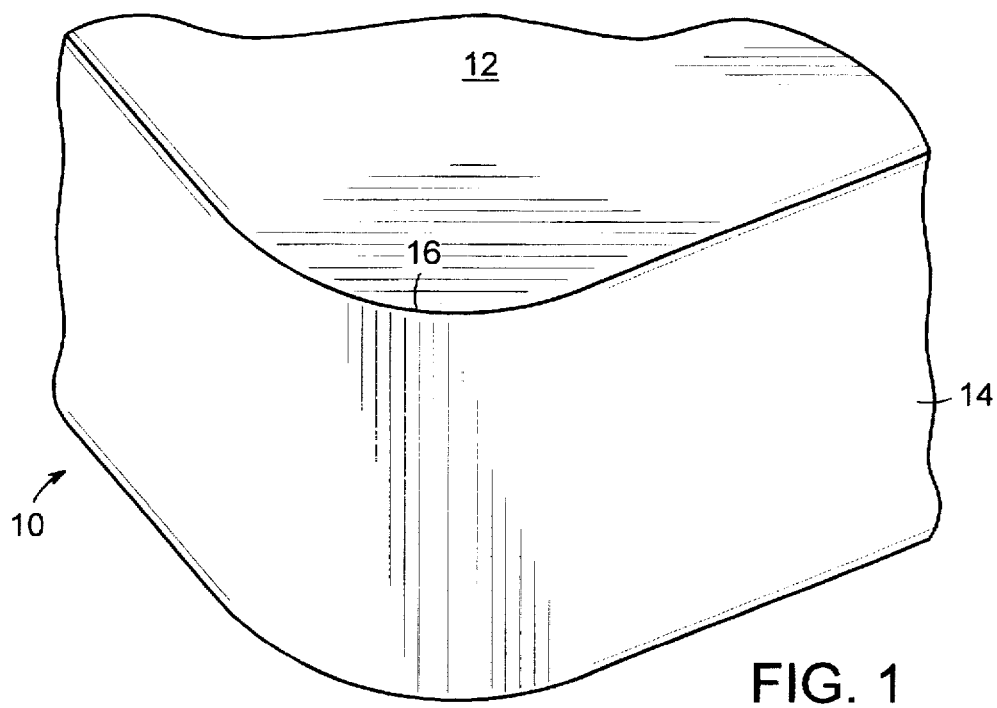
FIG. 1 is a schematic perspective view of a prior art CVD coated cutting tool insert blank prior to use.
Figure 2:
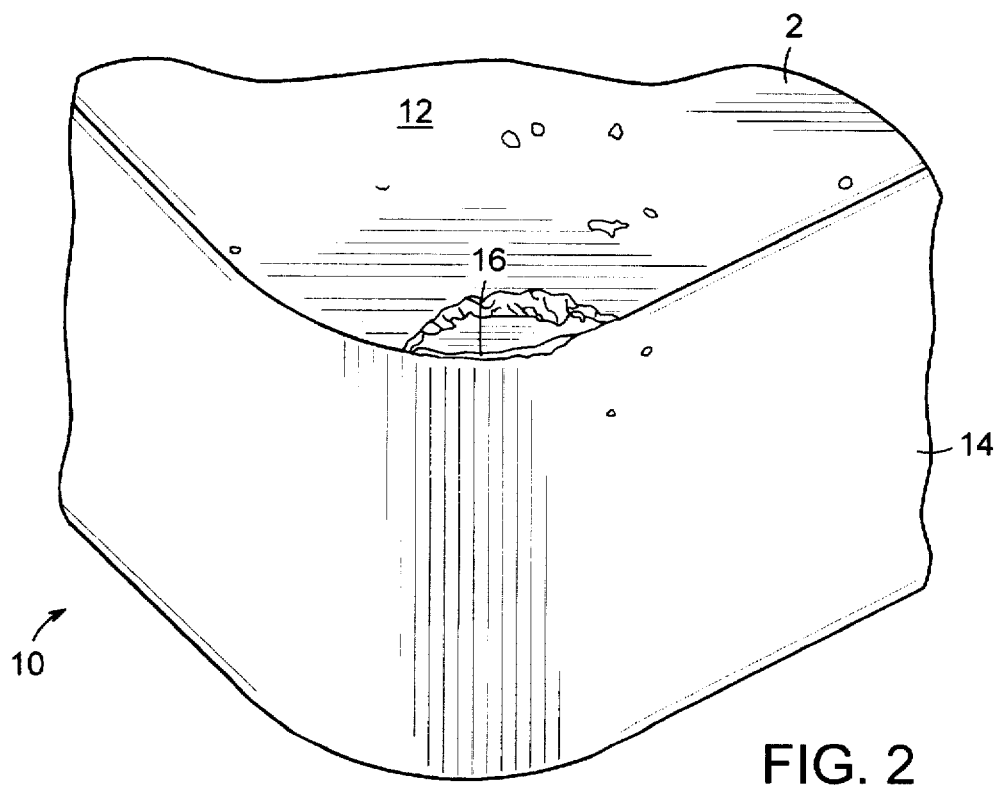
FIGS. 2–5 show the prior art tool of FIG. 1 after varying degrees of use.
Figure 3:
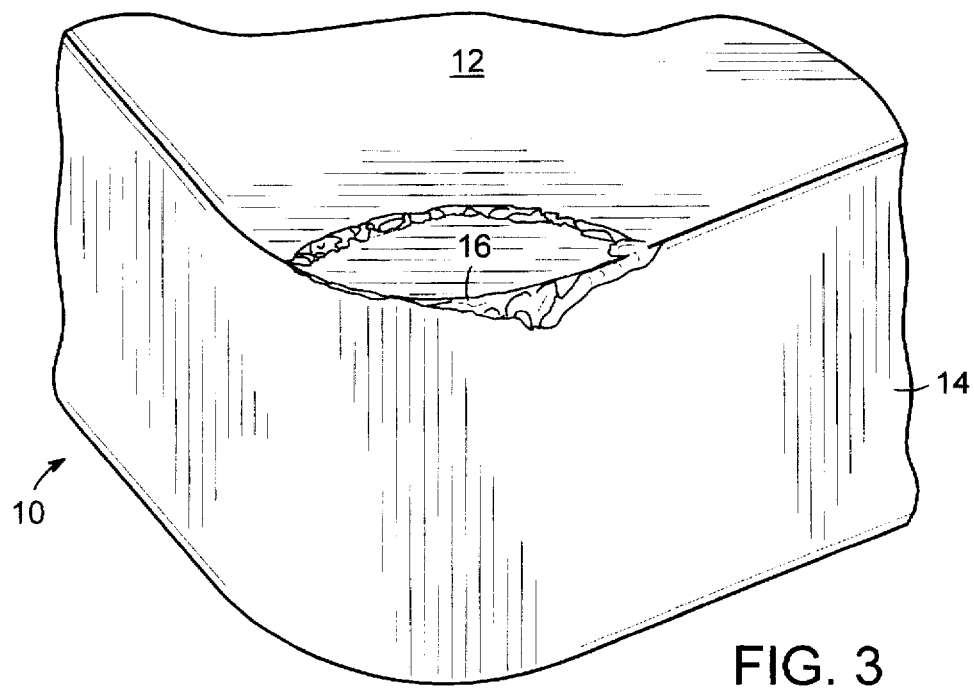
Figure 4:
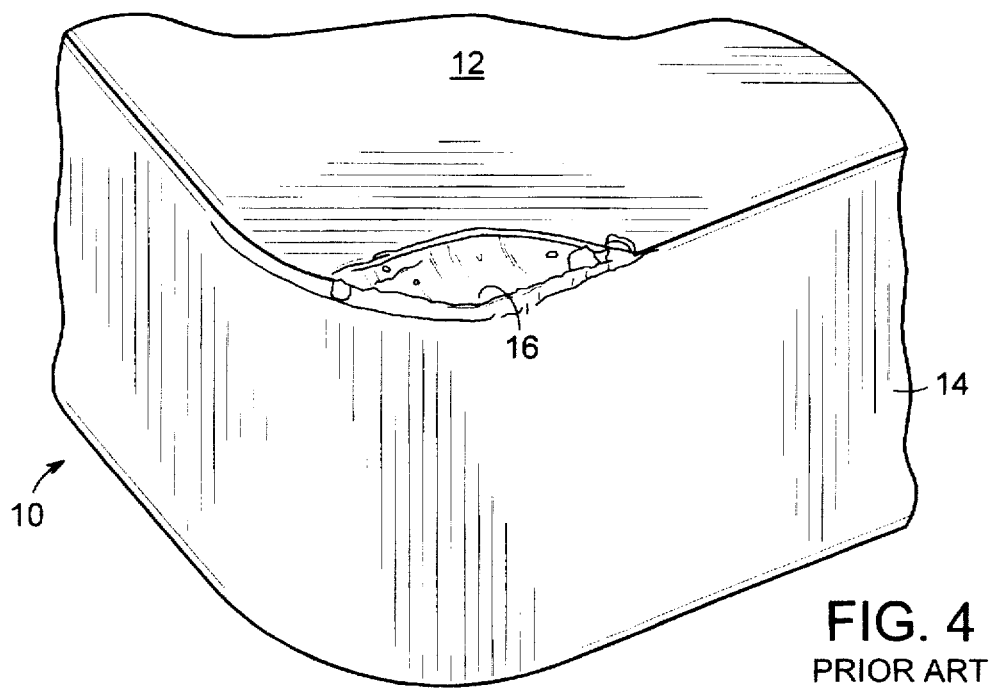
Figure 5:
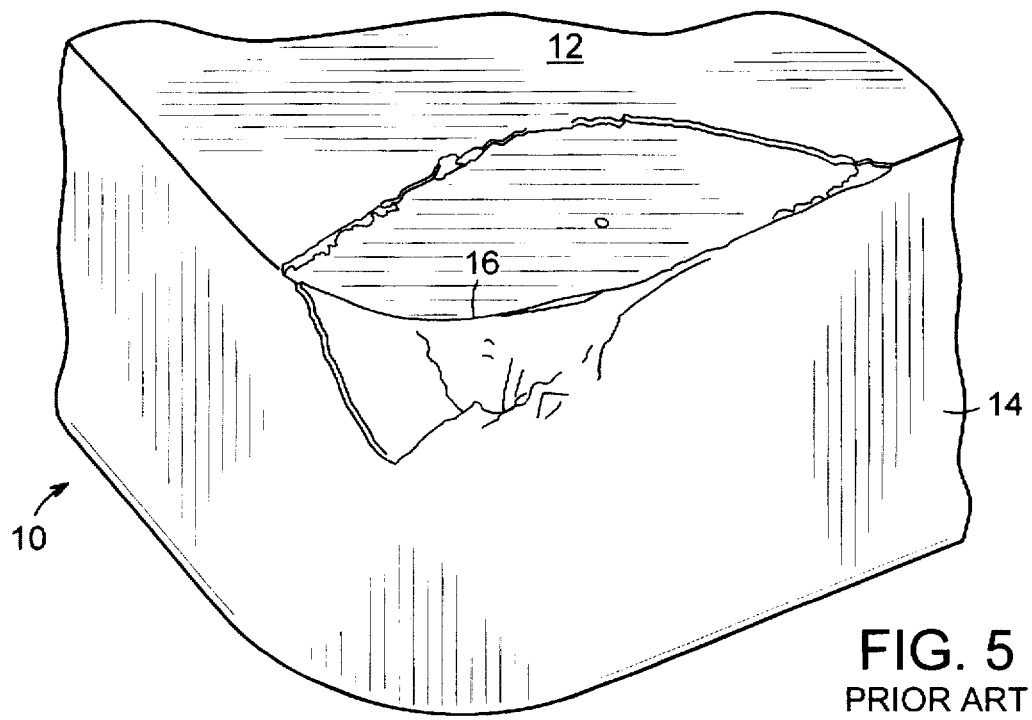
Figure 6:
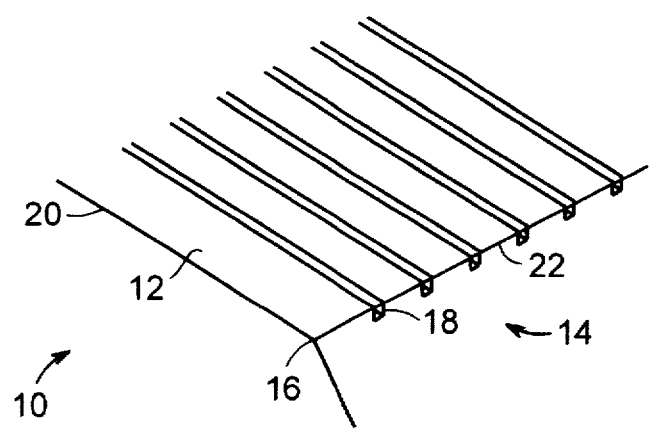
FIG. 6 is a broken schematic perspective view of a prior art cutting tool insert prepared with parallel surface grooves prior to CVD coating.
Figure 7:
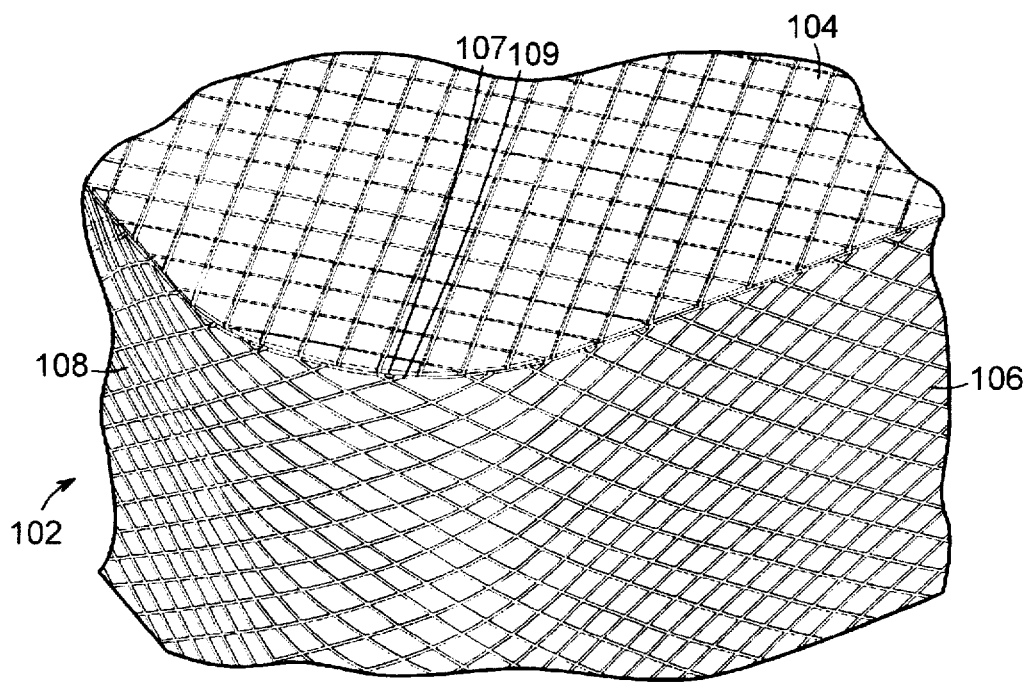
FIG. 7 is a schematic perspective view of a cutting tool insert prepared according to a first embodiment of the invention prior to CVD coating.
Figure 8:
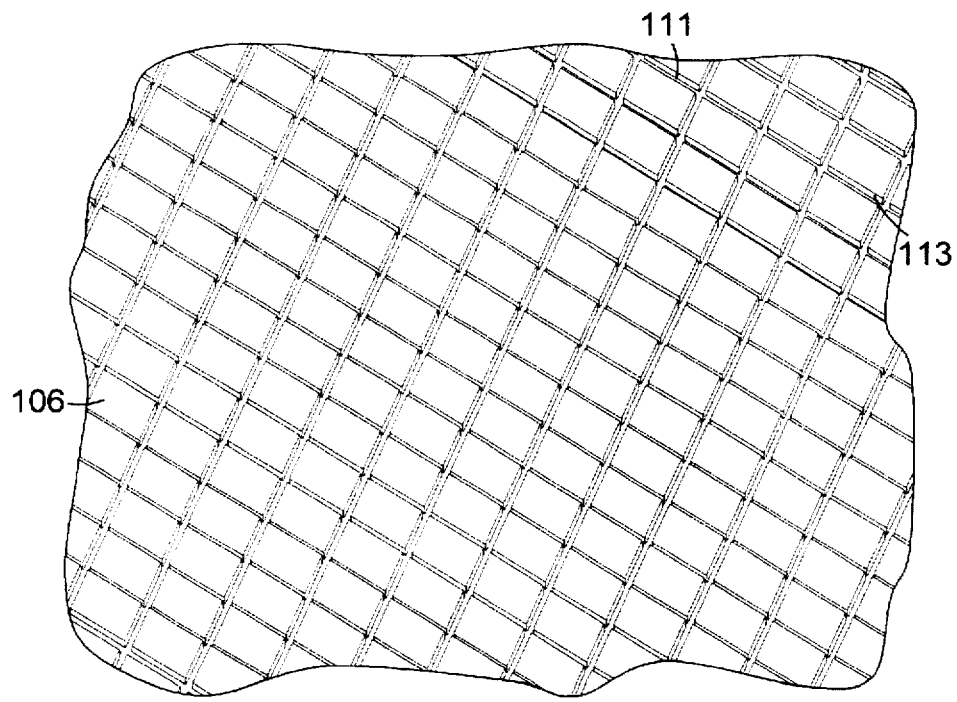
FIG. 8 is an enlarged view of the pattern formed on the insert of FIG. 7.

Referring now to FIGS. 7 and 8, a rectangular cutting tool insert 102 has an upper surface 104 and flank or side surfaces 106, 108, etc., and lower surface (not shown). One or more corners, e.g. 107, of the insert are sharpened to form a cutting edge 109. The insert may be provided with a central mounting hole (not shown). The insert 102 is typically formed from a tungsten carbide (WC) substrate by known machining or molding techniques. However, other suitable substrate materials include silicon carbide (SiC), silicon nitride ($Si_3N_4$), other transition metal carbides, nitrides and borides, zirconium alumina ($Al_2O_3$–$ZrO_2$), and alumina ($Al_2O_3$). According to a first embodiment of the invention, the upper surface 104 and the flank surfaces 106, 108, etc. are scored to form a cross-hatch pattern (optionally a diamond hatch pattern). Scoring may be achieved by means of laser ablation or by molding as described in detail below.

The cross-hatch pattern is formed by scoring a plurality of diagonal grooves, e.g. 111, 113. That is, the grooves are not parallel to any edge of the tool. The grooves are preferably approximately 15–20 microns deep, 10–15 microns wide, and are spaced apart approximately 50–100 microns. As mentioned above, the scores may be achieved by laser ablation. According to a presently preferred embodiment of the invention, an Nd-Yag laser having a frequency of 2.5 kHz and a cutting power of 6 Watts is used to create the grooves. After the grooves are scored, the insert is etched in a 10% solution of $HNO_3$ for approximately 8 minutes. The etching removes cobalt at and 5–10 microns below the surface of the insert and cleans the loose particles left from the laser scribing process. After etching, diamond is deposited on the insert using a conventional CVD process.

In lieu of laser ablation, the cross-hatch or the diamond-hatch pattern may be applied to the insert by molding using a mold having the hatched pattern.

Figure 9:
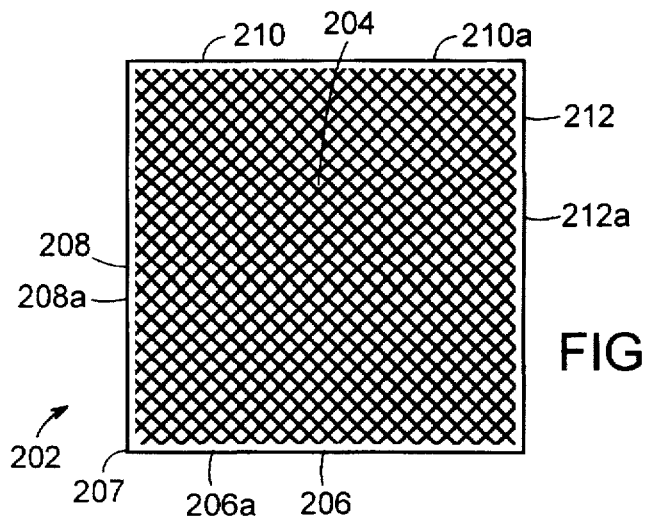
FIG. 9 is a schematic top plan view of a cutting tool insert prepared according to a second embodiment of the invention prior to CVD coating.
Figure 10:
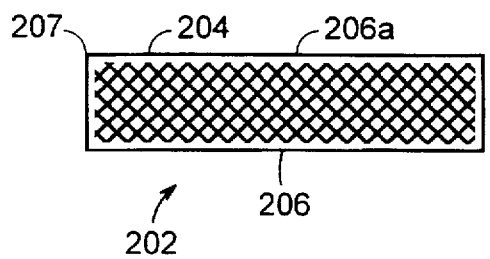
FIG. 10 is a schematic side elevation view of the cutting tool insert of FIG. 9.

Turning now to FIGS. 9 and 10, a cutting tool insert 202 according to a second embodiment of the invention has an upper surface 204 and flank or side surfaces 206, 208, 210, 212, and lower surface (not shown). Each of the flank surfaces forms an edge 206a, 208a, 210a, 212a at respective intersections of the flank surfaces with the upper surface. One or more corners, e.g. 207, of the insert are sharpened to form a cutting edge. According to the second embodiment of the invention, the upper surface 204 and the flank surfaces 206, 208, etc. are scored to form a cross-hatch pattern (optionally a diamond hatch pattern) which does not extend to the edges 206a, 208a, etc. of the insert and particularly not to the cutting edge 207. Preferably, the hatched groove pattern ends approximately 100 μm from the edges.

Figure 11:
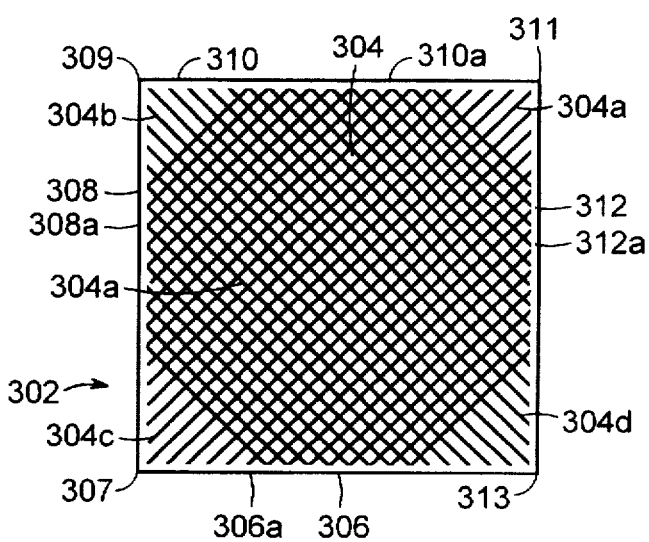
FIG. 11 is a schematic top plan view of a cutting tool insert prepared according to a third embodiment of the invention prior to CVD coating.
Figure 12:
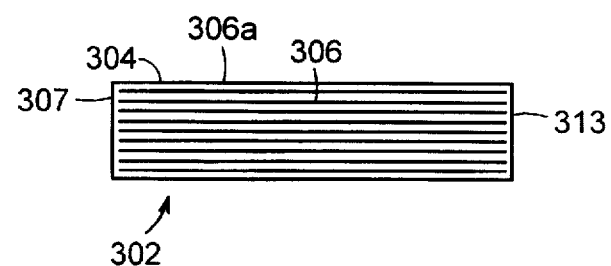
FIG. 12 is a schematic side elevation view of the cutting tool insert of FIG. 11.

A third and presently preferred embodiment of the invention is shown in FIGS. 11 and 12. Here, the cutting tool insert 302 has an upper surface 304 which is scored with a cross hatch pattern in a central region 304a thereof. Corner regions 304b–304e of the upper surface 304 are not cross hatched, but are scored with parallel diagonal lines as seen best in FIG. 11. Neither the hatched pattern nor the parallel corner scores extend to the edges of the upper surface. The side surfaces 306–312 are scored with parallel lines which are substantially parallel to the upper surface 304. The scores on the side surfaces also do not extend to the edges of the tool. As in the second embodiment, the scores (grooves) preferably end approximately 100μm from the edges (306a–312a, 307, 309, 311, and 313).

Cutting tool inserts were made according to the different embodiments of the invention and tested in several ways. Three tungsten carbide inserts were made. A first control insert was made by etching the surface but without scoring the surface prior to CVD coating. A second insert was made by scoring the top surface, but not the side surfaces, prior to etching and CVD coating. A third insert was made by scoring the top and side surfaces prior to etching and CVD coating. The inserts were tested by cutting an aluminum workpiece. Inspections and measurements of the inserts were made after five, ten, fifteen, and twenty minutes of use. In addition, a polycrystalline diamond (PCD) cutting tool was tested for wear at the same time intervals on an aluminum workpiece.

The first control insert exhibited spalling of diamond coating on the top and side surfaces after wear-through. The second insert exhibited spalling of the diamond coating on the side surfaces but not the top surface after wear through. The third insert exhibited no spalling after wear-through.

In addition, the wear characteristics of the inserts made according to the invention compared favorably to the PCD cutting tool. The third embodiment of the invention actually showed better wear characteristics than the PCD tool after five and ten minutes of use.

There have been described and illustrated herein methods of preparing cutting tool substrate materials for diamond coating and diamond coated cutting tool inserts made according to these methods. While particular embodiments of the invention have been described, it is not intended that the invention be limited thereto, as it is intended that the invention be as broad in scope as the art will allow and that the specification be read likewise. Thus, while rectangular inserts are disclosed, inserts of other geometric shapes may be used as well. In addition, while cross-hatch and diamond-hatch patterns have been shown, other patterns may achieve substantially the same results. It is preferable, however, that the scores on the top surface be arranged at an angle relative to the edges of the substrate. Furthermore, while particular cutting and finishing techniques have been disclosed with reference to the scoring method for placing a pattern on the tool inserts before diamond deposition, other cutting and finishing techniques may be used as well. For example, while laser cutting and molding methods have been disclosed, the pattern of grooves may be achieved by other means such as milling. Moreover, while honing and etching methods of finishing have been disclosed, other methods may be used as well. It will therefore be appreciated by those skilled in the art that yet other modifications could be made to the provided invention without deviating from its spirit and scope as claimed.

I claim:

1. A method for preparing a cutting tool substrate material prior to coating the tool substrate material with a diamond coating, said method comprising:

scoring at least a portion of the top surface of the cutting tool substrate material with a first pattern of grooves; and scoring at least a portion of at least two adjacent side surfaces of the cutting tool substrate material with a second pattern of grooves, said portions of said top and two adjacent side surfaces excluding areas immediately adjacent to a cutting edge of the cutting tool substrate material.

2. A method according to claim 1, wherein:
said first and second patterns are cross-hatch patterns.

3. A method according to claim 1, wherein:
said first and second patterns are diamond-hatch patterns.

4. A method according to claim 1, wherein:
said first pattern of grooves on said portion of said top surface includes a hatched pattern, and said second pattern of grooves on said portion of said side surfaces is a pattern of parallel lines, parallel to said top surface.

5. A method according to claim 1, wherein:
said first pattern of grooves on said portion of said top surface includes a central hatched pattern and non-hatched parallel line patterns at corners of said top surface.

6. A method according to claim 5, wherein:
said non-hatched parallel line patterns are oriented at an angle relative to at least one edge of said top surface.

7. A method according to claim 1, further comprising:
honing the cutting tool substrate material.

8. A method according to claim 7, further comprising:
chemically etching the cutting tool substrate material.

9. A method for preparing a cutting tool substrate material prior to coating the tool substrate material with a diamond coating, the cutting tool substrate having a top surface, at least three side surfaces, and at least three edges formed by the intersection of the side surfaces with the top surface, said method comprising:
scoring at least a portion of the top surface of the cutting tool substrate material with a first pattern of grooves, at least some of the grooves in said first pattern of grooves being oriented at an acute angle relative to at least one of the edges.

10. A method according to claim 9, wherein:
at least some of the grooves in said first pattern of grooves are oriented at an acute angle to all of the edges.

11. A method according to claim 10, further comprising:
scoring at least a portion of two adjacent side surfaces of the cutting tool substrate material with a second pattern of grooves.

12. A method according to claim 11 wherein:
said second pattern of grooves includes grooves parallel to the top surface.

13. A method according to claim 9, wherein:
said first pattern of grooves on said portion of said top surface includes a central hatched pattern and non-hatched parallel line patterns at corners of said top surface.

14. A method for preparing a cutting tool substrate material prior to coating the tool substrate material with a diamond coating, the cutting tool substrate having a top surface, at least two side surfaces, at least two top edges formed by the intersection of the side surfaces with the top surface, and at least one side edge formed by the intersection of side surfaces with each other, said method comprising:
scoring a portion of the top surface of the cutting tool substrate material with a first pattern of grooves, said portion of the top surface excluding areas immediately adjacent to at least one of the top edges.

15. A method according to claim 14, wherein:
said portion of the top surface excludes areas immediately adjacent to at least two of the top edges.

16. A method according to claim 14, further comprising:
scoring a portion of at least one side surface of the cutting tool substrate material with a second pattern of grooves, said portion of the at least one side surface excluding areas immediately adjacent to at least one of the side edges.

17. A method according to claim 14, wherein:
said first pattern of grooves on said portion of said top surface includes a central hatched pattern and non-hatched parallel line patterns at corners of said top surface.

18. A diamond coated cutting tool, comprising:
a) a substrate having a top surface, at least two adjacent side surfaces, at least two top edges formed by the intersection of respective side surfaces with said top surface, and at least one cutting edge, said substrate having a first pattern of grooves on at least a portion of said top surface and a second pattern of grooves on at least a portion of said at least two adjacent side surfaces, said portion of said top surface and said portion of said at least two adjacent side surfaces excluding areas immediately adjacent to said cutting edge; and
b) a layer or diamond deposited on said substrate.

19. A diamond coated cutting tool according to claim 18, wherein:
said first and second patterns are one of a cross-hatch or diamond-hatch pattern.

20. A diamond coated cutting tool according to claim 18, wherein:
said first pattern is one of a cross-hatch or diamond-hatch pattern, and said second pattern of grooves includes grooves which are substantially parallel to said top surface.

21. A diamond coated cutting tool according to claim 18, wherein:
said first pattern of grooves includes grooves oriented at an acute angle to at least one of said top edges.

22. A diamond coated cutting tool according to claim 18, wherein:
said first pattern of grooves on said portion of said top surface includes a central hatched pattern and non-hatched parallel line patterns at corners of said top surface.

23. A diamond coated cutting tool, comprising:
a) a substrate having a top surface, at least two adjacent side surfaces, at least two top edges formed by the intersection of respective side surfaces with said top surface, and at least one cutting edge, said substrate having a first pattern of grooves on at least a portion of said top surface, said first pattern of grooves including grooves oriented at an acute angle to at least one of said top edges; and
b) a layer or diamond deposited on said substrate.

24. A diamond coated cutting tool according to claim 23, wherein:
said portion of said top surface excludes areas immediately adjacent to said cutting edge.

25. A diamond coated cutting tool according to claim 23, wherein:
said first pattern of grooves on said portion of said top surface includes a central hatched pattern and non-hatched parallel line patterns at corners of said top surface.

26. A diamond coated cutting tool, comprising:

a) a substrate having a top surface, at least two adjacent side surfaces, at least two top edges formed by the intersection of respective side surfaces with said top surface, and at least one cutting edge, said substrate having a first pattern of grooves on a portion of said top surface, said portion of said top surface excluding areas immediately adjacent to said cutting edge; and b) a layer or diamond deposited on said substrate.

27. A diamond coated cutting tool according to claim 26, wherein:

said first pattern of grooves on said portion of said top surface includes a central hatched pattern and non-hatched parallel line patterns at corners of said top surface.

* * * * *